United States Patent [19]

Marx

[11] Patent Number: 5,124,642
[45] Date of Patent: Jun. 23, 1992

[54] POWER LINE POST INSULATOR WITH DUAL INDUCTOR CURRENT SENSOR

[75] Inventor: Thomas I. Marx, Hingham, Mass.
[73] Assignee: Sigma Instruments, Inc., Weymouth, Mass.
[21] Appl. No.: 455,523
[22] Filed: Dec. 21, 1989
[51] Int. Cl.[5] ............................................. G01R 1/20
[52] U.S. Cl. ................................... 324/127; 174/139; 324/117 R
[58] Field of Search ................... 324/127, 129, 117 H, 324/117 R, 157; 174/139; 336/180, 208, 220

[56] References Cited

U.S. PATENT DOCUMENTS 3,251,014  5/1966  Stein, Jr. .............................. 174/139
3,386,059  5/1968  Stein, Jr. et al. ..................... 324/127
4,717,872  1/1988  Wagner et al. ................. 324/117 H
4,839,600  6/1989  Kuustra ............................... 324/129

FOREIGN PATENT DOCUMENTS 290223  4/1971  U.S.S.R. .............................. 324/127

Primary Examiner—Ernest F. Karlsen
Attorney, Agent, or Firm—Stanger, Michaelson, Spivak & Wallace

[57] ABSTRACT

A power line post insulator has a housing that encloses two inductive sensors that transversely straddle a recess which receives the power conductor. Wires connect the sensors additively with respect to voltages induced by currents in the conductor between the sensors. The sensors may each include one or two additively connected coils.

14 Claims, 3 Drawing Sheets

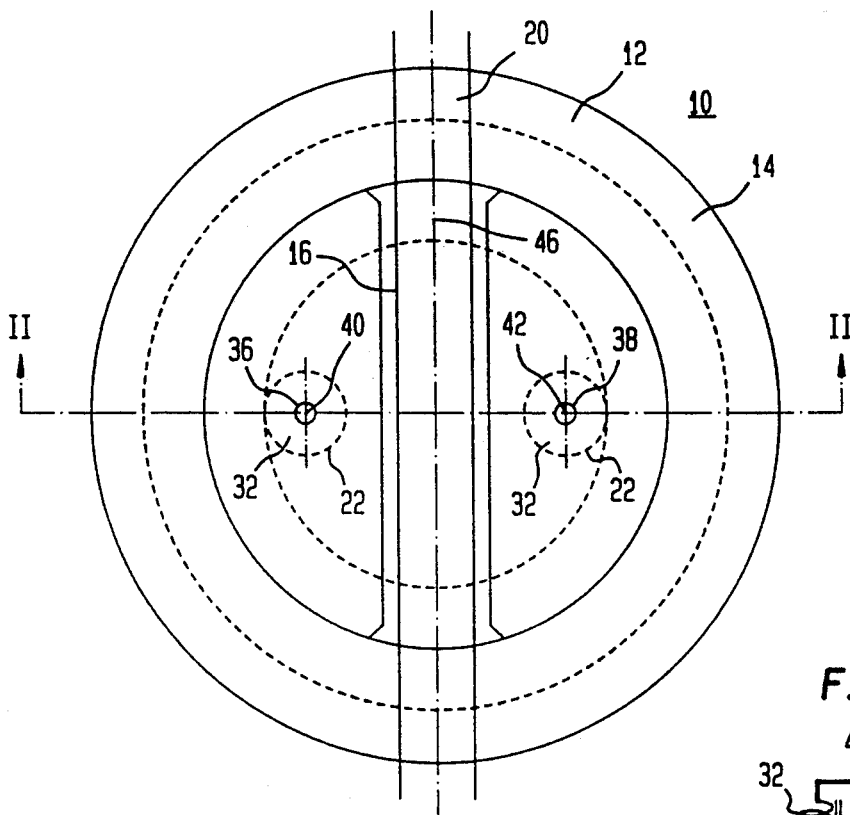
FIG. 1
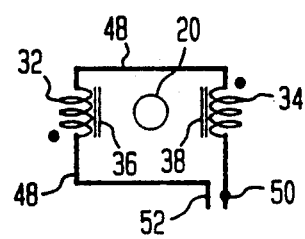
FIG. 3
FIG. 2
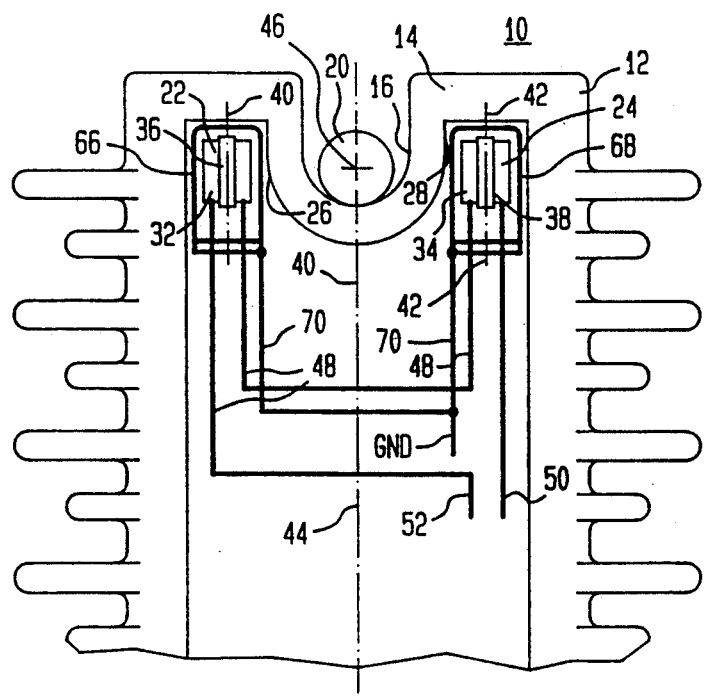

POWER LINE POST INSULATOR WITH DUAL INDUCTOR CURRENT SENSOR

BACKGROUND OF THE INVENTION

This invention relates to power line post insulators, and particularly to line post insulators with means for sensing currents in conductors of power systems.

Power line post insulators sometimes utilize a coil in the vicinity of the current carrying conductor to sense the conductor's currents. While such sensors generally exhibit good sensitivity they are susceptible to noise from voltages induced by adjacent conductors, such as may exist in multi-phase systems. Toroidal coils have been suggested to overcome noise. Such sensors display excellent sensitivity and noise rejection but must surround the conductor and also are excessively bulky for use in a line post insulator.

U.S. Pat. Nos. 4,700,123 and 4,859,925 of Thomas Beling, disclose line post insulators each having two current sensors that respond to currents in a conductor of a power system. According to these patents insulator housing surrounds two sensing coils on one side of the power conductor and the coils are connected subtractively to limit the noise generated by adjacent power lines in a multi-phase power system.

Such devices exhibit good rejection of noise from adjacent power lines but are comparatively insensitive because of the subtractive connection of the coils. They cause relatively high errors when used with power conductors whose diameters depart excessively from a predetermined diameter.

OBJECT AND SUMMARY OF THE INVENTION

An object of the invention is to improve power line post insulators with means to sense currents in conductors of power systems.

According to a feature of the invention, a line post insulator includes a housing with a recess for a power conductor, two inductive sensors located on opposite sides of the recess with axes parallel to each other and transverse to the direction of the conductor, and means for connecting the inductive sensors additively with respect to voltages induced by currents in the conductor.

According to another feature of the invention, each inductive sensor is composed of a single coil.

According to another feature of the invention, each inductive sensor includes two coaxial coils.

These and other features of the invention are pointed out in the claims. Other objects and advantages of the invention will become evident from the following detailed description when read in light of the accompanying drawings.

BRIEF DESCRIPTION OF THE DRAWINGS

FIG. 1 is a top view of a device embodying features of the invention.

FIG. 2 is a section II—II of FIG. 1.

FIG. 3 is a schematic diagram showing details of the circuitry in FIG. 1 and 2.

DETAILED DESCRIPTION OF PREFERRED EMBODIMENTS

Figure 4:
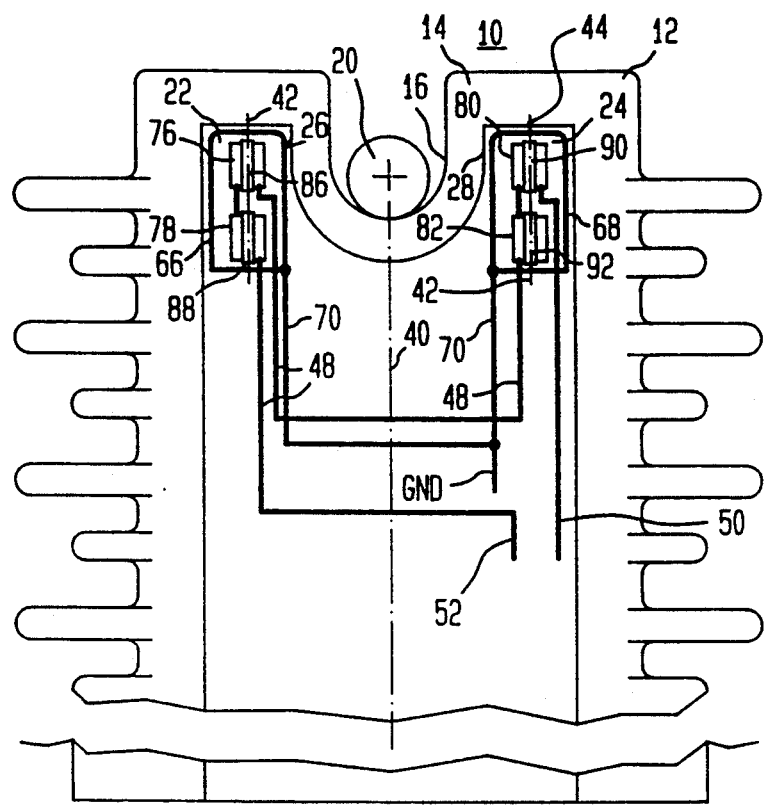
FIG. 4 and FIG. 7 are sections of another device embodying features of the invention.

On FIGS. 1 and 2 a line post insulator 10 includes a substantially cylindrical and hollow insulation housing 12 with an integral top 14, having a diametrical recess 16 that receives and supports a power conductor 20. A pair of inductive sensors 22 and 24 are mounted in interior recesses 26 and 28 on axially opposite sides of the conductor 20. The inductive sensors 22 and 24 are positioned to sense the varying fluxes which alternating currents through the conductor 20 generates circularly about the conductor. The currents through the conductor induce voltages in the inductive sensors 23 and 24. The latter constitute secondaries for the conductor 20 which acts as a primary.

According to the embodiment shown in FIG. 2, the inductive sensors 22 and 24 include respective coils 32 and 34 having respective cores 36 and 38 and axes 40 and 42 parallel to the axis 44 of the housing 12. The axes 40 and 42 are thus substantially transverse to the axis 46 of the conductor 20. The axial centers of the coils 32 and 34 lie approximately at the same horizontal level as the center of the conductor 20.

Conductive wires 48 connect the coils 32 and 34 additively in series to produce a signal at terminal 50 and 52. This appears more distinctly in FIG. 3 which shows the schematic diagram of the circuit of FIG. 2. According to an aspect of the invention the coils 32 and 34 in the insulation housing 12 ideally assume positions as close as is possible to be symmetrical about the expected location of the axis 46 of the conductor 20, and to have axes tangential to the fluxes that flow circularly about the conductor 20.

A pair of non-magnetic, non-ferrous, but conductive shields 66 and 68 surround the respective inductive sensors 22 and 24 to shield the latter from the voltage of the conductor 20 and the voltage noise that may appear on the conductor. The shields 66 and 68 shield the coils from the voltage stress field. Connecting lines 70 ground the shields 66 and 68. According to one embodiment of the invention the shields 66 and 68 are in the form of non-magnetic, non-ferrous, but conductive cans. According to other embodiments they are in the form of screens or coatings.

In operation, the currents passing through the conductor 20 generate fluxes circularly about the conductor and induce currents in the coils 32 and 34. The wires 48 connect the coils 32 and 34 additively and produce a signal proportional to the current in the conductor 20 at terminals 50 and 52. For example, the circularly generated flux may extend upwardly with respect to the coil 32 and downwardly with respect to the coil 34. The dotted side of coils 32 and 34 then may both appear positive. The additive connection of wires 48 adds the induce voltages.

The invention has the effect of maximizing the coupling between the primary formed by the conductor 20 and the secondaries formed by the inductive sensors 22 and 24, i.e. the coils 32 and 34. It reduces errors introduced by variations in cable size, cable droop, cable horizontal bend and cable vertical bend.

The invention also reduces neighboring phase angle errors. That is, the conductor 20 induces voltages in the coils 32 and 34 in opposite directions because the coils straddle the conductor, and the circuitry 48 is arranged to add the induced voltages. However, the coils 32 and 34 do not straddle neighboring conductors, for example, conductors to the right or left of the insulator 10. Hence, these conductors induce noise voltages in the same direction i.e., both up or both down in the coils 32 and 34, and the lines 48 subtract these induced noise voltages.

Conductors above and below the insulator induce comparatively small noise voltages because the coil 22, 24 axes extend substantially transverse to the circular flux which these conductors produce. On parallel conductors angularly displaced from the conductor 20, the invention combines the noise reducing effects of horizontally neighboring and vertically neighboring conductors.

The invention is based upon the recognition that the inductive sensors 22 and 24, i.e. the coils 32 and 34, approximate portions of a toroid surrounding the conductor 20. Such a toroid would result in maximum coupling between the conductor 20 and the sensor.

Figure 5:
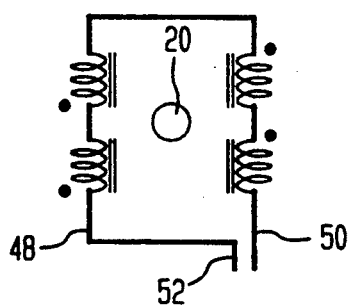
FIG. 5 is a schematic diagram illustrating circuitry in FIG. 4.

Another embodiment of the invention appears in FIGS. 4 and 5. Here the inductive sensors 22 and 24 each includes two coaxial coils 76, 78 and 80, 82 in series additive relation with respect to fluxes generated by the conductor 20. The two pairs of coils 76, 78 and 80, 82 have the same advantages of the single pair of coils 32 and 34, but offer the additional advantage of more closely approximating the maximal toroidal condition. Each coil in FIGS. 4 and 5 has a separate respective core 86, 88 and 90, 92. This embodiment offers the advantage of being less sensitive to differences in the diameters of various power conductors 20 which may be placed in the recess 16.

Figure 6:
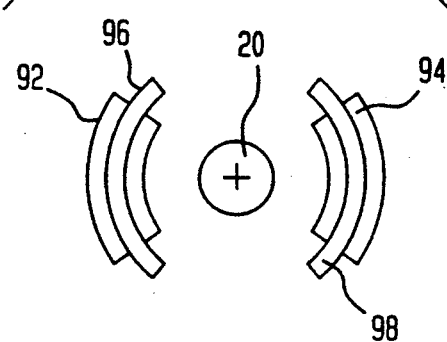
FIG. 6 is a schematic diagram of another embodiment of the invention.

Another embodiment of the invention appears in FIG. 6. Here the inductive sensors 22 and 24 are composed of coils 92 and 94 which curve slightly about the axis 46 to approximate a toroid. Each coil 92 and 94 has a separate core 96 and 98.

Suitable brackets hold the inductive sensors 22 and 24 in the cans 60 and 68. Suitable known silicone rubber potting compounds hold the shields 66 and 68 in the recesses 26 and 28.

Figure 7:
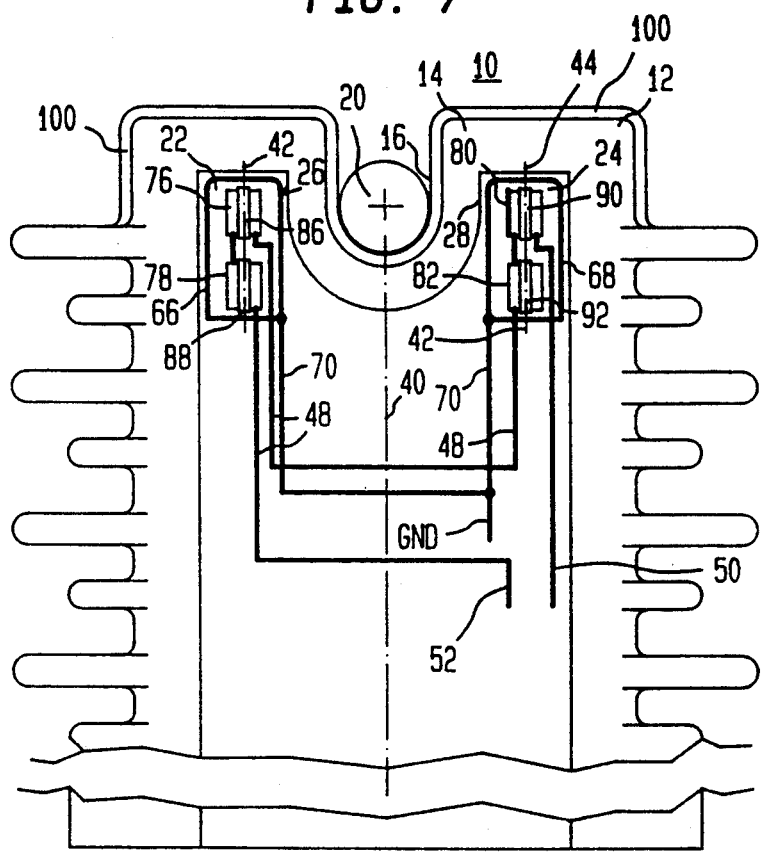

According to another embodiment, shown in FIG. 7, a conductive coating 100 covers the top 14 to control the voltage stress field which the voltage at the conductor 20 may create. The coating 100 may also serve as a capacitor plate to couple to another conductive plate to measure the voltage of the conductor 20 relative to ground. Capacitor measurement is disclosed in the aforementioned U.S. Pat. No. of T. E. Beling No. 4,700,123 and No. 4,859,925.

The conductive coating 100 may be used as a capacitor plate to couple to the wire 70 to measure the voltage of the conductor 20 relative to ground. In that case, suitable current sensing means determine the current in the wire 70 as a measure of the voltage of the conductor 20 relative to ground. The coating 100 is applicable to the structure both of FIG. 2 and FIG. 4.

According to another embodiment of the invention, the coils 32 and 34 are air coils without cores 36 and 38. According to still another embodiment of the invention, the coils 76, 78 and 80, 82 are air core and do not have cores 86, 88 and 90, 92.

It is desirable to make the coils 32 and 34, 76, 78 and 80, 82 as short as possible so as not to require too deep a depth for the recess 16. Preferably the center of the conductor 20 is at the same horizontal level as the longitudinal centers of the coils 32 and 34, and in FIG. 4 the same level as the vertical centers between the coils 76 and 78 on the one hand and 80 and 82 on the other.

While embodiments of the invention are described in detail, it will be evident to those skilled in the art that the invention may be embodied otherwise without departing from its spirit and scope.

What is claimed is:

1. A line post insulator for a power conductor, comprising:
    a line post insulator housing for insulating a conductor, said housing having a substantially hollow interior and being closed from above;
    said insulator housing forming an elongated recess insulated from the hollow interior for receiving a power conductor;
    a pair of inductive means inside the hollow interior for responding to currents and mounted on opposite sides of the insulated elongate recess of said line post housing in positions to have voltages induced therein by a conductor in the recess; and
    conductive means for connecting said inductive means additively relative to voltages induced by currents in a conductor in the recess.

2. An apparatus as in claim 1, wherein said conductive means connect said inductive means in a substantially unreactive manner.

3. An apparatus as in claim 1, wherein each of said inductive means includes a coil having an axis, the axis of one of said coils being spaced from the axis of the other coil, the axis of each coil being transverse to the elongated direction of the recess.

4. An apparatus as in claim 1, wherein each of said inductive means includes a pair of coils connected additively and having a single axis; the axis of the pairs of coils in one inductive means being and parallel to the axis of the pair of coils in the other inductive means and being transverse to the direction along which the conductor extends when the conductor is in the recess.

5. An apparatus as in claim 4, wherein said inductive means each defines an axis, the axes being offset from each other and substantially parallel to each other, the axes being transverse to the direction along which the conductor extends when the conductor is in the recess.

6. An apparatus as in claim 1, wherein each of said inductive means defines an axis, the axes of said inductive means being parallel and arranged for maximum sensitivity to the current in the conductor when a conductor is in the recess.

7. An apparatus as in claim 1, wherein the inductive means are located substantially to straddle a conductor in the elongated housing.

8. An apparatus as in claim 1, wherein said recess holds said conductor and said housing in substantially fixed positions relative to each other.

9. An apparatus as in claim 1, wherein said recess is sufficiently deep to place a conductor between said inductive means.

10. An apparatus as in claim 3, wherein said coils straddle a conductor in the elongated housing.

11. An apparatus as in claim 3, wherein said recess is sufficiently deep to place a conductor between said coils.

12. A line post insulator for a power conductor, comprising:
    a line post housing for insulating a conductor, said housing having a substantially hollow interior and being closed from above;
    said insulator housing forming an elongated recess insulated from the hollow interior for receiving a power conductor and substantially fixing the power conductor and the insulator housing relative to each other;

sensing means in the interior of said housing for sensing currents in a conductor located in the recess through the insulator housing;

said sensing means including a pair of inductive means inside the hollow interior for responding to currents and mounted on opposite sides of the insulated elongate recess in positions to have the voltages induced therein by a conductor in the recess; and conductive means for connecting said inductive means additively relative to the voltage induced by currents in a conductor in the recess.

13. An apparatus as in claim 12, wherein said recess is sufficiently deep to place a conductor between said inductive means.

14. An apparatus as in claim 12, wherein each of said inductive means includes a coil having an axis, the axis of one of said coils being spaced from the axis of the other coil, the axis of each coil being transverse to the elongated direction of the recess, said recess being sufficiently deep to place a conductor between said coils.

* * * * *